US012672425B2

(12) United States Patent
Zhu et al.

(10) Patent No.: US 12,672,425 B2
(45) Date of Patent: Jun. 30, 2026

(54) LIGHT-EMITTING DEVICE AND METHOD FOR MANUFACTURING SAME, AND DISPLAY SUBSTRATE AND DISPLAY APPARATUS

(71) Applicants: BEIJING BOE TECHNOLOGY DEVELOPMENT CO., LTD., Beijing (CN); BOE Technology Group Co., Ltd., Beijing (CN)

(72) Inventors: Youqin Zhu, Beijing (CN); Dong Li, Beijing (CN); Guangru Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 483 days.

(21) Appl. No.: 18/261,357

(22) PCT Filed: Nov. 29, 2021

(86) PCT No.: PCT/CN2021/133899
§ 371 (c)(1),
(2) Date: Jul. 13, 2023

(87) PCT Pub. No.: WO2023/092537
PCT Pub. Date: Jun. 1, 2023

(65) Prior Publication Data
US 2024/0074226 A1    Feb. 29, 2024

(51) Int. Cl.
*H10K 50/16* (2023.01)
*H10K 50/115* (2023.01)
(Continued)

(52) U.S. Cl.
CPC ......... *H10K 50/166* (2023.02); *H10K 50/115* (2023.02); *H10K 71/16* (2023.02); *H10K 2102/351* (2023.02)

(58) Field of Classification Search
CPC .......................... H10K 50/115; H10K 50/166
See application file for complete search history.

(56) References Cited

U.S. PATENT DOCUMENTS

| | | | |
|---|---|---|---|
| 2012/0199837 A1 | 8/2012 | Kobayashi et al. | |
| 2021/0020838 A1 | 1/2021 | Qin | |
| 2022/0320454 A1* | 10/2022 | Mei | H10K 50/16 |

FOREIGN PATENT DOCUMENTS

| | | |
|---|---|---|
| CN | 110571343 A | 12/2019 |
| CN | 110600623 A | 12/2019 |

(Continued)

*Primary Examiner* — Daniel P Shook
(74) *Attorney, Agent, or Firm* — WHDA, LLP

(57) ABSTRACT

A light-emitting device and a manufacturing method thereof, a display substrate and a display apparatus are provided in the embodiments of the present disclosure. The light-emitting device includes: a first electrode disposed on a base substrate; a quantum dot light-emitting layer disposed at a side of the first electrode away from the base substrate; and an electron transport layer disposed at a side of the quantum dot light-emitting layer close to or away from the first electrode, the electron transport layer including a first transport sub-layer and a second transport sub-layer which are arranged in layer configuration, a material of the first transport sub-layer and a material of the second transport sub-layer both including n-type metal oxides, and an oxygen content of the first transport sub-layer being less than an oxygen content of the second transport sub-layer.

20 Claims, 10 Drawing Sheets

(51) Int. Cl.
     *H10K 71/16*     (2023.01)
     *H10K 102/00*    (2023.01)

(56)                References Cited

FOREIGN PATENT DOCUMENTS

CN        110890467  A     3/2020
CN        111146346  A     5/2020
CN        112614956  A     4/2021

* cited by examiner

LIGHT-EMITTING DEVICE AND METHOD FOR MANUFACTURING SAME, AND DISPLAY SUBSTRATE AND DISPLAY APPARATUS

TECHNICAL FIELD

The present disclosure relates to the technical field of display and, more particularly, to a light-emitting device and a manufacturing method thereof, a display substrate and a display apparatus.

BACKGROUND

Quantum dots (QDs) have become a strong competitor of new display technology due to their advantages of narrow luminescent spectrum, adjustable luminescent wavelength by size, high luminescent efficiency, etc. N-type metal oxide (for example, zinc oxide) nanoparticle films are often used as electron transport layers in electroluminescent quantum dot light-emitting devices.

SUMMARY

A light-emitting device and a manufacturing method thereof, a display substrate and a display apparatus are provided in the embodiments of the present disclosure.

The embodiments of the present disclosure provide a light-emitting device, including: a first electrode disposed on a base substrate;

a quantum dot light-emitting layer disposed at a side of the first electrode away from the base substrate; and an electron transport layer disposed at a side of the quantum dot light-emitting layer close to or away from the first electrode, the electron transport layer including a first transport sub-layer and a second transport sub-layer which are arranged in layer configuration, a material of the first transport sub-layer and a material of the second transport sub-layer both including n-type metal oxides, and an oxygen content of the first transport sub-layer being less than an oxygen content of the second transport sub-layer.

In some embodiments, a thickness of the first transport sub-layer is 2 to 4 times a thickness of the second transport sub-layer.

In some embodiments, a total thickness of the electron transport layer is between 5 nm and 150 nm.

In some embodiments, the first transport sub-layer is arranged at a side of the quantum dot light-emitting layer away from the base substrate, and the second transport sub-layer is arranged at a side of the first transport sub-layer away from the base substrate.

In some embodiments, the first transport sub-layer is arranged between the quantum dot light-emitting layer and the first electrode, and the second transport sub-layer is arranged between the first transport sub-layer and the first electrode.

In some embodiments, the light-emitting device further includes a hole injection layer, a hole transport layer and a second electrode, wherein the first electrode is arranged opposite to the second electrode, the hole injection layer, the hole transport layer, the electron transport layer and the quantum dot light-emitting layer are all arranged between the first electrode and the second electrode, the hole transport layer is arranged at a side of the quantum dot light-emitting layer away from the electron transport layer and the hole injection layer is arranged at a side of the hole transport layer away from the quantum dot light-emitting layer.

In some embodiments, the electron transport layer is made of at least one of: zinc oxide, zinc magnesium oxide, gallium doped zinc oxide or aluminum doped zinc oxide.

The embodiments of the present disclosure provide a manufacturing method of a light-emitting device, including:

forming a first electrode on a base substrate; and forming an electron transport layer and a quantum dot light-emitting layer respectively, wherein the quantum dot light-emitting layer is arranged at a side of the first electrode away from the base substrate; and the electron transport layer is arranged at a side of the quantum dot light-emitting layer close to or away from the first electrode;

wherein forming the electron transport layer includes:

forming a first transport sub-layer and a second transport sub-layer respectively through a sputtering process, wherein a material of the first transport sub-layer and a material of the second transport sub-layer both includes n-type metal oxides; and a sputtering gas in forming the first transport sub-layer includes an inert gas, and a sputtering gas in forming the second transport sub-layer includes an inert gas and oxygen.

In some embodiments, in forming the second transport sub-layer, a flow of the oxygen is 1% to 30% of a flow of the inert gas.

In some embodiments, the flow of the inert gas is between 30 sccm to 60 sccm in forming the second transport sub-layer.

In some embodiments, a thickness of the first transport sub-layer is 2 to 4 times a thickness of the second transport sub-layer.

In some embodiments, a total thickness of the electron transport layer is between 5 nm and 150 nm.

In some embodiments, in forming the first transport sub-layer and the second transport sub-layer, an air pressure in a sputtering chamber is between 0.4 Pa and 1 Pa, and power of a radio frequency source in the sputtering chamber is between 20 W and 150 W.

In some embodiments, the step of forming the first transport sub-layer is performed before or after the step of forming the quantum dot light-emitting layer; and the step of forming the second transport sub-layer is performed after or before the step of forming the first transport sub-layer.

In some embodiments, the step of forming the electron transport layer is performed before the step of forming the quantum dot light-emitting layer, and the manufacturing method further includes:

forming the hole transport layer at a side of the quantum dot light-emitting away from the base substrate;

forming the hole injection layer at a side of the hole transport layer away from the base substrate; and forming the second electrode at a side of the hole injection layer away from the base substrate;

or, the step of forming the electron transport layer is performed after the step of forming the quantum dot light-emitting layer, and the manufacturing method further includes:

forming the hole injection layer at the side of the first electrode away from the base substrate;

forming the hole transport layer at the side of the hole injection layer away from the base substrate; and forming the second electrode at the side of the electron transport layer away from the base substrate.

The embodiments of the present disclosure provide a display substrate, including the light-emitting device stated above.

The embodiments of the present disclosure provide a display apparatus, including the display substrate stated above.

BRIEF DESCRIPTION OF THE DRAWINGS

The accompanying drawings are intended to provide further understanding of the present disclosure and constitute a part of the specification, which, together with the following detailed description, serve to explain the present disclosure, but do not constitute limitation on the present disclosure. In the drawings.

DETAILED DESCRIPTION

The following is a detailed description of the specific embodiments of the present disclosure in combination with the drawings. It should be understood that the specific embodiments described herein are intended only to illustrate and interpret the present disclosure and are not intended to limit the present disclosure.

Unless otherwise defined, the technical terms or scientific terms used in the present disclosure shall have the usual meaning understood by those skilled in the art to which the present disclosure belongs. The use of "first," "second," and similar terms in the present disclosure does not imply any order, quantity, or importance, but rather serves to distinguish different components. Similarly, words such as "including" or "containing" or other similar words mean that the component or object present before the word covers the component or object listed after the word and its equivalent, and does not exclude other components or objects. The term "connection" or "connecting" or other similar terms is not limited to physical or mechanical connections, but can include electrical connections, whether direct or indirect. "Up", "down", "left", "right", etc., are used only to indicate the relative position relationship. When the absolute position of the described object changes, the relative position relationship may also change accordingly.

N-type metal oxide (for example, zinc oxide) nanoparticle films are often used as electron transport layers in electroluminescent quantum dot light-emitting devices. In related art, zinc oxide nanoparticle films can be prepared with a solution method. However, there are a lot of surface states in the zinc oxide nanoparticle film prepared with the solution method, and the surface states of the zinc oxide nanoparticle film interact with a quantum dot light-emitting layer, which reduces light emitting efficiency of quantum dots. A reason for a lot of surface states existing in preparing the zinc oxide nanoparticle film with the solution method is that a surface of a zinc oxide nanoparticle needs to be connected with ligands to be dissolved in a solvent, but once the ligands shed, defects occur on the surface of the zinc oxide nanoparticle.

Figure 1:
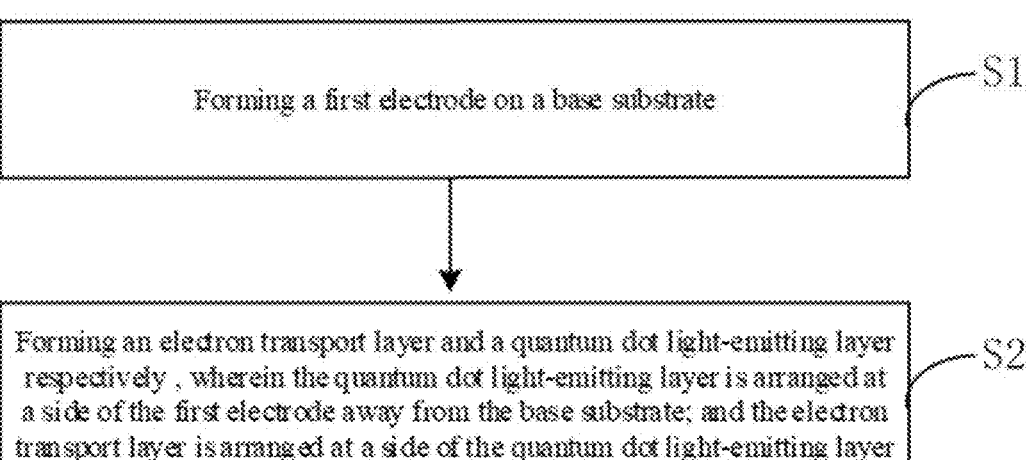
FIG. 1 is a flowchart of a manufacturing method of a light-emitting device according to an embodiment of the present disclosure.

FIG. 1 is a flowchart of a manufacturing method of a light-emitting device according to an embodiment of the present disclosure. As shown in FIG. 1, the manufacturing method includes steps S1 and S2.

S1, a first electrode is formed on a base substrate.

S2, an electron transport layer and a quantum dot light-emitting layer are respectively formed. The quantum dot light-emitting layer is arranged at a side of the first electrode away from the base substrate; and the electron transport layer is arranged at a side of the quantum dot light-emitting layer close to or away from the first electrode.

It should be noted that the manufacturing method in the present disclosure can be used to manufacture an upright light-emitting device or an inverted light-emitting device. In fabricating the upright light-emitting device, the first electrode is used as an anode of the light-emitting device, and in step S2, the quantum dot light-emitting layer is formed first and then the electron transport layer is formed at the side of the quantum dot light-emitting layer away from the first electrode. In fabricating the inverted light-emitting device, the first electrode is used as a cathode of the light-emitting device, and in step S2, the electron transport layer is formed first and then the quantum dot light-emitting layer is formed at a side of the electron transport layer away from the first electrode.

A step of forming the electron transport layer includes following steps: respectively forming a first transport sub-layer and a second transport sub-layer through a sputtering process. A material of the first transport sub-layer and a material of the second transport sub-layer both include n-type metal oxides. A sputtering gas in forming the first transport sub-layer includes an inert gas, and a sputtering gas in forming the second transport sub-layer includes an inert gas and oxygen. The sputtering process is specifically a magnetron sputtering process.

The first transport sub-layer can be formed first and then the second transport sub-layer is formed. Alternatively, the second transport sub-layer can be formed first and then the first transport sub-layer is formed.

In the embodiment of the present disclosure, the electron transport layer is formed by the sputtering process. Compared with an electron transport layer prepared by the solution method, the sputtering process does not involve ligands, so that a large number of surface states may not occur on the electron transport layer due to ligand shedding, thereby improving light emitting efficiency of the quantum dot light-emitting layer. In addition, in sputtering the electron transport layer, if the sputtering gas does not contain the oxygen, a large number of oxygen vacancies may be easily caused in the electron transport layer. Although the oxygen vacancies facilitates electron transport, they may also reduce the light-emitting efficiency of the quantum dot light-emitting layer; and if there are less oxygen vacancies, electron transport capacity may degrade sharply. However, in the embodiment of the present disclosure, the oxygen is not introduced in forming the first transport sub-layer of the electron transport layer; and the inert gas and oxygen are introduced in forming the second transport sub-layer of the electron transport layer. In this way, the oxygen vacancies in the second transport sub-layer can be reduced, while a large number of oxygen vacancies exist in the first transport sub-layer, thus, for the whole electron transport layer, the light emitting efficiency of the quantum dot light-emitting layer while guaranteeing the electron transport capability is improved.

In an embodiment of the present disclosure, the electron transport layer can be made of at least one of: zinc oxide (ZnO), magnesium zinc oxide (ZnMgO), gallium doped zinc oxide (ZnGaO), and aluminum doped zinc oxide (ZnAlO). For example, in forming the first transport sub-layer and the second transport sub-layer, targets in a sputtering chamber are all ZnO targets, and a material of the formed first transport sub-layer and a material of the formed second transport sub-layer both include ZnO. As another example, in forming the first transport sub-layer and the second transport sub-layer, targets in the sputtering chamber are ZnMgO targets, and the material of the formed first transport sub-layer and the material of the formed second transport sub-layer both include ZnMgO. As another example, in forming one of the first transport sub-layer and the second transport sub-layer, a target used is a ZnO target; and in forming the other one of the first transport sub-layer and the second transport sub-layer, the target material used is a ZnMgO target, so that the material of one of the first transport sub-layer and the second transport sub-layer includes ZnO and the material of the other include ZnMgO.

Figure 2:
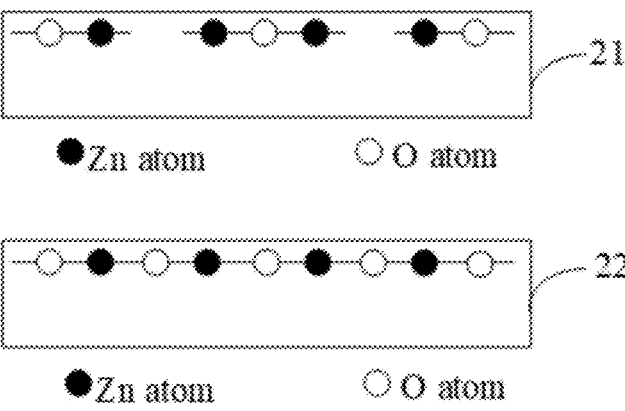
FIG. 2 is a schematic diagram of element distribution in a first transport sub-layer and a second transport sub-layer according to some embodiments of the present disclosure.
Figure 3:
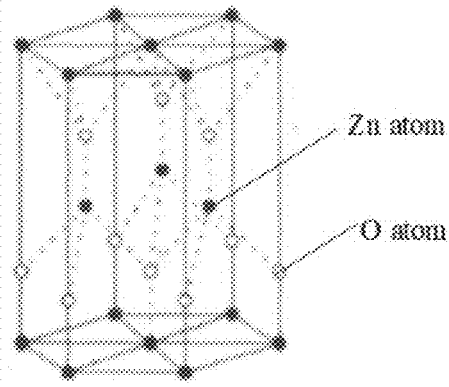
FIG. 3 is a schematic diagram of a lattice structure of ZnO according to some embodiments of the present disclosure.

In the embodiment of the present disclosure, that the material of the first transport sub-layer and the material of the second transport sub-layer include ZnO and the inert gas is argon are taken as an example for illustration. FIG. 2 is a schematic diagram of element distribution in a first transport sub-layer and a second transport sub-layer according to some embodiments of the present disclosure. FIG. 3 is a schematic diagram of a lattice structure of ZnO according to some embodiments of the present disclosure. As shown in FIG. 2, the first transport sub-layer is formed by sputtering in an oxygen-free atmosphere, so that a large number of oxygen vacancies are generated inside the first transport sub-layer; and the second transport sub-layer 22 is formed by sputtering in an oxygen atmosphere, and oxygen vacancies in the second transport sub-layer 22 are reduced. It should be noted that the element distribution in FIG. 2 is only a schematic representation, and an actual lattice structure of ZnO refers to the lattice structure in FIG. 3, in which solid dots represent oxygen atoms and hollow circles represent zinc atoms. For the first transport sub-layer 21 and the second transport sub-layer 22, a lot of oxygen vacancies occur in the lattice structure of ZnO in the first transport sub-layer 21, while less or no oxygen vacancies exist in the lattice structure of ZnO in the second transport sub-layer 22.

Figure 4:
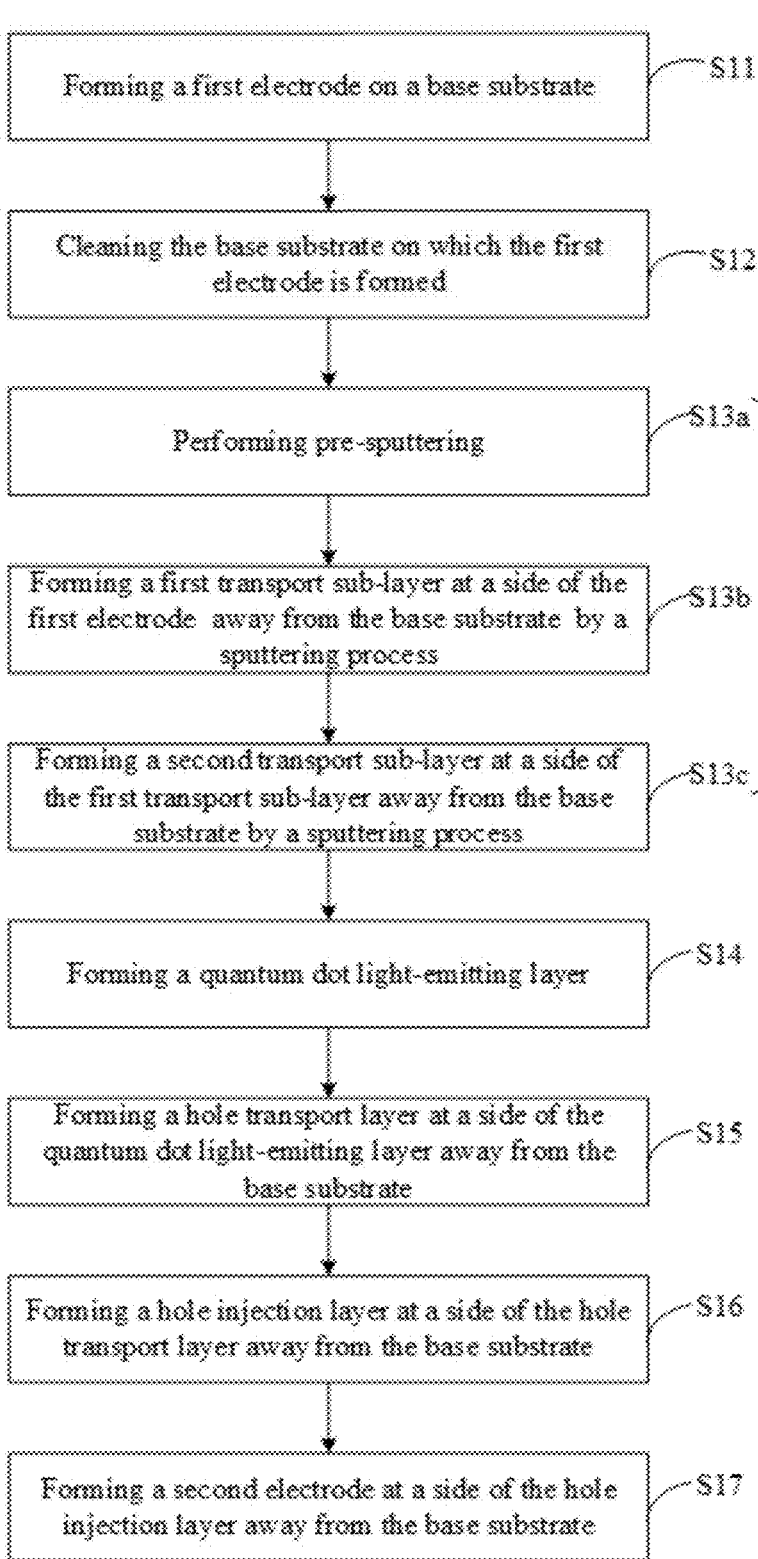
FIG. 4 is a flowchart of a manufacturing method of a light-emitting device according to some other embodiments of the present disclosure.
Figure 5:
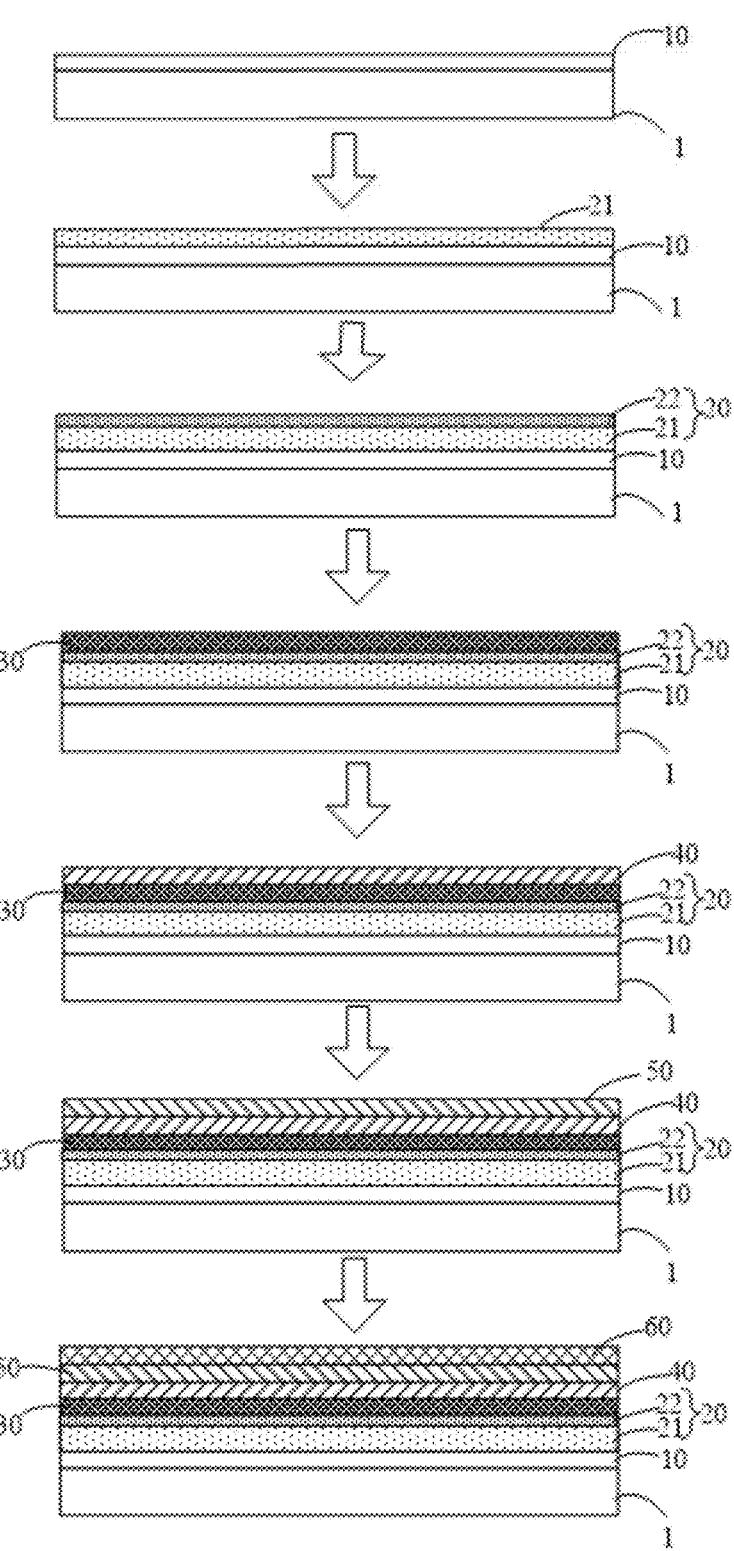
FIG. 5 is a schematic structural diagram corresponding to the manufacturing method in FIG. 4.

FIG. 4 is a flowchart of a manufacturing method of a light-emitting device according to some other embodiments of the present disclosure, and FIG. 5 is a schematic structural diagram corresponding to the manufacturing method in FIG. 4, wherein the manufacturing method in FIG. 4 can be used to manufacture the inverted light-emitting device. As shown in FIG. 4 and FIG. 5, the manufacturing method of the light-emitting device can include following steps S11 to S17.

S11, a first electrode 10 is formed on a base substrate 1.

Illustratively, the light-emitting device has a bottom emission structure, and the first electrode 10 can be made of a transparent metal material, such as indium tin oxide (ITO). In this step S11, the first electrode 10 may be formed by a process such as evaporation or sputtering.

S12, the base substrate 1 on which the first electrode 10 is formed is cleaned.

In this step, the base substrate 1 on which the first electrode 10 is formed can be cleaned with deionized water and isopropyl alcohol. For example, the base substrate is cleaned with the deionized water and isopropyl alcohol respectively for 15 minutes, which is then blew dry with nitrogen, and baked and dried for 5 minutes at a baking temperature of, for example, 135° C. Further, the base substrate 1 on which the first electrode 10 is formed can be treated by ultraviolet ozone for 5 to 10 minutes, for example, 10 minutes, so as to clean organic pollutants on a surface of the first electrode 10 and to passivate defects on the surface of the first electrode 10.

S13, an electron transport layer 20 is formed. Step S13 may specifically include steps S13a to S13c.

S13a, pre-sputtering is performed. Specifically, when an air pressure in a sputtering chamber reaches $5*10^{-4}$ Pa, an inert gas is introduced, with a flow of the inert gas between 30 sccm and 60 sccm (for example, a flow of the inert gas is between 40 sccm and 50 sccm), so that the air pressure in the sputtering chamber is kept between 0.4 Pa to 1 Pa, for example, between 0.5 Pa and 0.6 Pa. Power of a radio frequency source in the sputtering chamber is set to be 20 W to 150 W, for example, 50 W to 100 W, to perform glow starting (i.e., pre-sputtering). During the glow starting, a baffle is disposed above the base substrate 1, so that after a target material is bombarded, a film is formed on the baffle by sputtering. The glow starting functions in removing impurities on the target. Duration of step S13a may be between 3 and 10 minutes, for example, 5 minutes, to fully remove impurities on the target. After step S13a is completed, the baffle is opened, so that a film can be formed on the base substrate 1 by sputtering.

S13b, a first transport sub-layer 21 is formed at a side of the first electrode 10 away from the base substrate 1 by a sputtering process, and a material of the first transport sub-layer 21 includes an n-type metal oxide.

Optionally, an air pressure in the sputtering chamber is between 0.4 Pa and 1 Pa, and the power of the radio frequency source in the sputtering chamber is between 20 W and 150 W. For example, the air pressure in the sputtering chamber is 0.4 Pa, or 0.6 Pa, or 0.8 Pa, or 1 Pa. For example, the power of the radio frequency source in the sputtering chamber is 20 W, or 40 W, or 60 W, or 80 W, or 100 W, or 120 W, or 140 W or 150 W. The flow of the inert gas is between 30 sccm and 60 sccm, and in this way, the first transport sub-layer 21 is formed on the first electrode 10 by sputtering.

Optionally, in step S13*b*, the flow of the inert gas is between 40 sccm and 50 sccm, and for example, the flow of the inert gas is 40 sccm, or 42 sccm, or 44 sccm, or 46 sccm, or 48 sccm, or 50 sccm.

S13*c*, a second transport sub-layer 22 is formed at a side of the first transport sub-layer 21 away from the base substrate 1 by a sputtering process, and a material of the second transport sub-layer 22 includes ZnO.

Optionally, in step S13*c*, the air pressure of the sputtering chamber and the power of the radio frequency source remain the same as those in step S13*b*. A sputtering gas introduced in step S13*c* includes the inert gas and oxygen. The flow of the inert gas can be kept the same as the flow of the inert gas in step S13*b*, and the flow of the oxygen can be 1% to 30% of the flow of the inert gas, preferably 2% to 10% of the flow of the inert gas, thus the oxygen vacancies in the second transport sub-layer 22 are appropriately reduced and the light emitting efficiency of the quantum dot light-emitting layer 30 is improved, while high electron transport capability of the second transport sub-layer 22 is guaranteed.

For example, in step S13*c*, the flow of the inert gas is between 30 sccm and 60 sccm, and the flow of the oxygen is between 0.3 sccm and 18 sccm. For example, the flow of the inert gas is 30 sccm and the flow of the oxygen is 0.3 sccm, or 1 sccm, or 3 sccm, or 5 sccm, or 7 sccm, or 9 sccm. As another example, the flow of the inert gas is 40 sccm, and the flow of the oxygen is 0.4 sccm, or 1 sccm, or 3 sccm, or 5 sccm, or 7 sccm, or 9 sccm, or 12 sccm. As another example, the flow of the inert gas is 50 sccm, and the flow of the oxygen is 0.5 sccm, or 1 sccm, or 3 sccm, or 5 sccm, or 7 sccm, or 9 sccm, or 12 sccm, or 15 sccm. As another example, the flow of the inert gas is 60 sccm, and the flow of the oxygen is 0.6 sccm, or 1 sccm, or 3 sccm, or 5 sccm, or 7 sccm, or 9 sccm, or 12 sccm, or 15 sccm, or 18 sccm.

Table 1 is an energy level parameter table of ZnO films prepared under different process conditions provided in the embodiments of the present disclosure. As shown in Table 1, when the flow of the inert gas is 50 sccm and the flow of the oxygen is 0.5 sccm, a valence band maximum (VBM) energy level of a sputtered ZnO film reaches 7.55 eV, and a conduction band minimum energy level decreases to 4.34 eV. When the flow of the inert gas is 50 sccm and the flow of the oxygen is 1 sccm, the valence band maximum energy level of the sputtered ZnO film reaches 7.43 eV, and the conduction band minimum energy level decreases to 4.22 eV, which is closer to a LUMO energy level of the quantum dots, facilitating electron injection into the quantum dot light-emitting layer 30. Therefore, in step S13*c*, the flow of the inert gas can be set to 50 sccm and the flow of the oxygen can be set to 1 sccm.

TABLE 1

| Process condition | VBM (eV) | CBM (eV) |
|---|---|---|
| Inert gas: 50 sccm | 7.76 | 4.57 |
| Inert gas: 50 sccm<br>Oxygen: 0.5 sccm | 7.55 | 4.34 |
| Inert gas: 50 sccm<br>Oxygen: 1 sccm | 7.43 | 4.22 |

In addition, a ratio of a thickness of the first transport sub-layer 21 to a thickness of the second transport sub-layer 22 can be controlled by controlling a ratio of duration in which the inert gas is introduced in step S13*b* to duration in which the sputtering gas is introduced in step S13*c*. In some embodiments, the duration in which the inert gas is introduced in step S13*b* is 2 to 4 times (for example, 3 times) the duration in which the sputtering gas is introduced in step S13*c*, so that the thickness of the first transport sub-layer 21 is 2 to 4 times (for example, 3 times) the thickness of the second transport sub-layer 22. For example, the duration in which the inert gas is introduced in step S13*b* is 30 minutes, and the duration in which the sputtering gas is introduced in step S13*c* is 10 minutes.

In addition, a total thickness of the electron transport layer 20 can be made to be within a target range by controlling sputtering duration, the air pressure in the sputtering chamber and power of a sputtering source in steps S13*b* and S13*c*. In some embodiments, the total thickness of the electron transport layer 20 is between 5 nm and 150 nm. When the thickness of the electron transport layer 20 is too large or too small, the electron transport capacity of the electron transport layer 20 may be affected. Therefore, preferably the total thickness of the electron transport layer 20 is between 20 nm and 70 nm, so that the electron transport layer 20 has a higher electron transport capacity. For example, the total thickness of the electron transport layer 20 is 20 nm, or 30 nm, or 40 nm, or 50 nm, or 60 nm, or 70 nm.

After step S13, step S14 is performed to form a quantum dot light-emitting layer 30. The quantum dot light-emitting layer 30 can be formed at a side of the electron transport layer 20 away from the base substrate 1 by a spin coating method, an inkjet printing or blade coating method.

In one embodiment, step S14 specifically includes steps S14*a* and S14*b*.

In step S14*a*, a quantum dot solution can be spin-coated on the electron transport layer 20 by a spin-coating method. A thickness of the quantum dot light-emitting layer 30 is controlled through a concentration of the quantum dot solution and a spin-coating speed. The quantum dot solution can be an InP-based quantum dot solution, a CdSe-based quantum dot solution, a ZnTeSe-based quantum dot solution or a perovskite quantum dot solution. For example, the CdSe-based quantum dot solution can be used. A thickness of the quantum dot light-emitting layer 30 may be between 10 nm and 80 nm, preferably between 20 nm and 50 nm.

S14*b*, the quantum dot solution is solidified. Optionally, the quantum dot solution is baked on a heating platform or in an oven at a temperature of 80 to 150° C. for 5 to 30 minutes, for example, baked on a heating platform at 120° C. for 10 minutes.

After step S14, steps S15 to S17 are performed.

Step S15, a hole transport layer 40 is formed at a side of the quantum dot light-emitting layer 30 away from the base substrate 1.

In one embodiment, the hole transport layer 40 can be formed by thermal evaporation deposition, with vacuum of a evaporation machine is between $5*10^{-4}$ and $4*10^{-4}$ Pa Pa. The hole transport layer 40 includes, for example, a stacked structure of tris (4-carbazole-9-ylphenyl) amine (TCTA) and N,N'-diphenyl-N,N'-(1-naphthyl)-1,1'-biphenyl-4,4'-di-amine (NPB). A thickness of the TCTA layer can be between 2 nm and 20 nm and a thickness of the NPB layer can be between 10 nm and 50 nm; preferably, the thickness of the TCTA layer is between 5 nm and 10 nm and the thickness of the NPB layer is between 20 nm and 30 nm, thereby hole mobility of the hole transport layer 40 is improved.

Step S16, a hole injection layer 50 is formed at a side of the hole transport layer 40 away from the base substrate 1.

In one embodiment, the hole injection layer 50 can be formed by thermal evaporation deposition, with vacuum of the evaporation machine between $5*10^{-4}$ and $4*10^{-4}$ Pa. A material of the hole injection layer 50 may include molybdenum trioxide ($MoO_3$), with a thickness between 2 nm and 20 nm, for example, the thickness of the hole injection layer 50 may be between 5 nm and 10 nm to improve hole injection ability.

Step S17, a second electrode 60 is formed at a side of the hole injection layer 50 away from the base substrate 1.

The second electrode 60 can be formed by a thermal evaporation deposition method, and the second electrode 60 can be made of a metal material, such as silver. A thickness of the second electrode 60 is between 1000 nm and 2000 nm.

After the second electrode 60 is formed, package resin and a cover glass can be formed, and the package resin is solidified in an ultraviolet solidified manner, so that the cover glass and the light-emitting device are fixedly bonded by using the package resin to protect the light-emitting device.

In a manufactured light-emitting device, because oxygen contents at different positions of the electron transport layer 20 are different, it can be determined whether the first transport sub-layer 21 and the second transport sub-layer 22 with different oxygen contents are formed by testing O content and Zn content at different depths of the thin film by secondary ion mass spectrometry.

Figure 6:
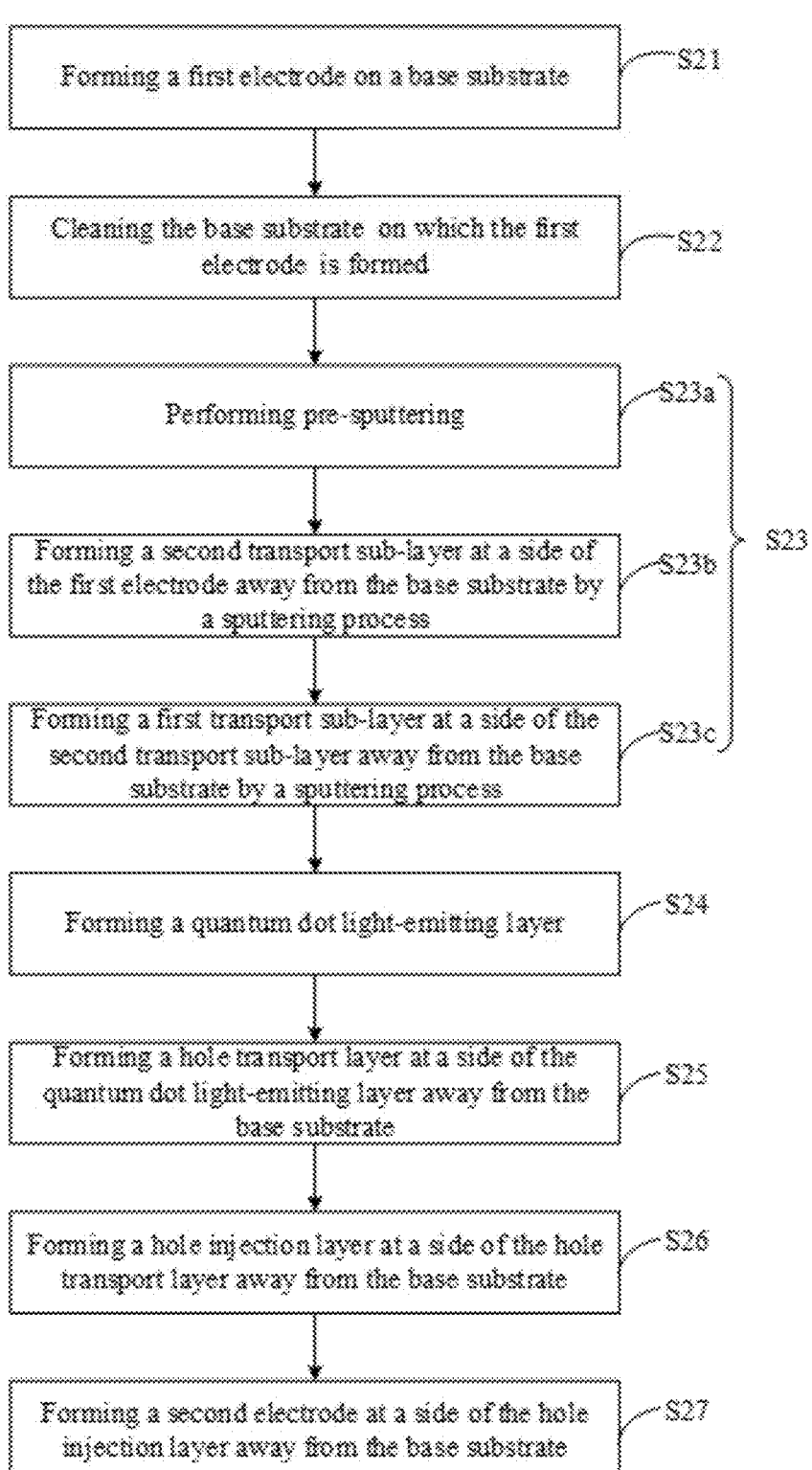
FIG. 6 is a flowchart of a manufacturing method of a light-emitting device according to further some embodiments of the present disclosure.
Figure 7:
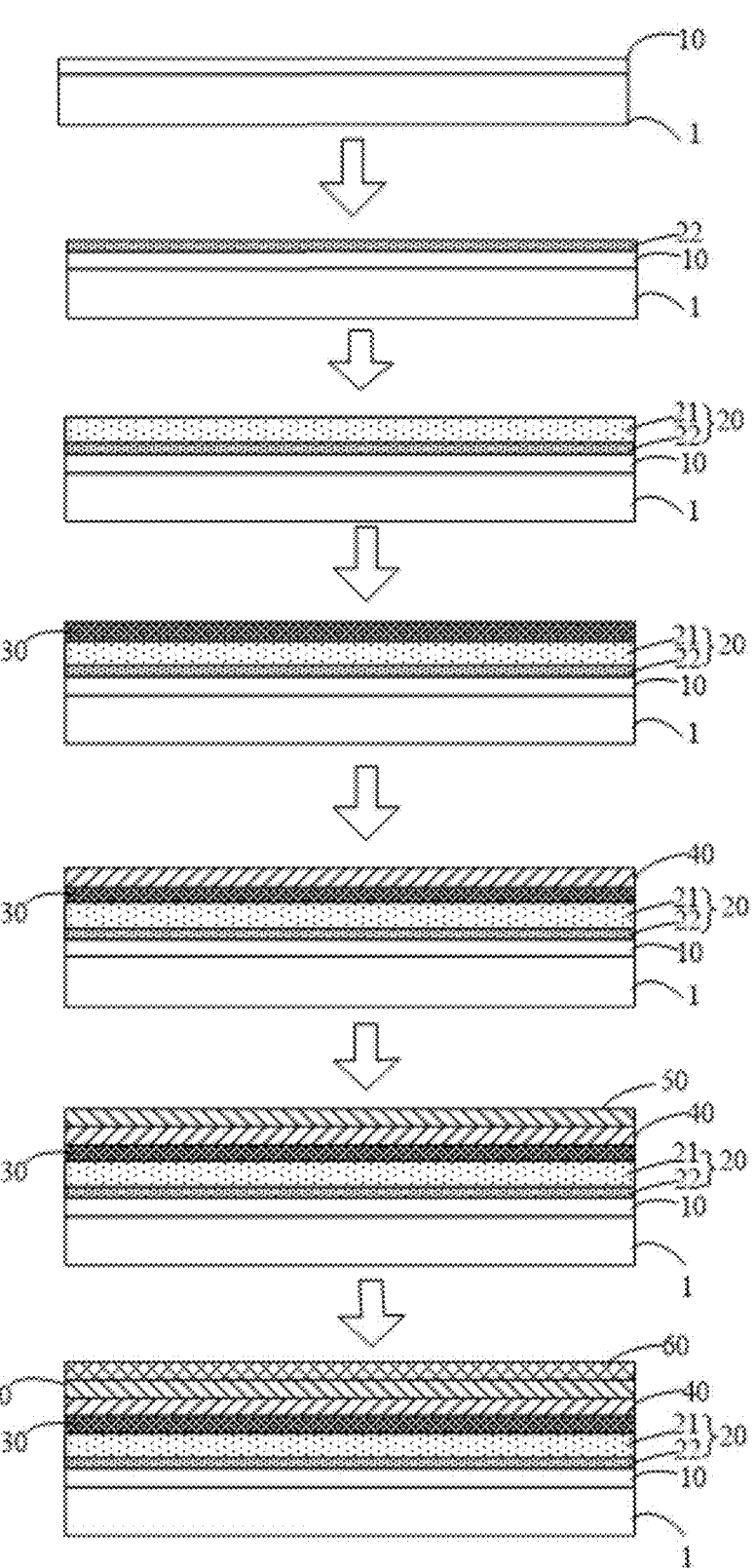
FIG. 7 is a schematic structural diagram corresponding to the manufacturing method in FIG. 6.

FIG. 6 is a flowchart of a manufacturing method of a light-emitting device according to further some embodiments of the present disclosure, and FIG. 7 is a schematic structural diagram corresponding to the manufacturing method in FIG. 6 which is used for manufacturing an inverted light-emitting device. As shown in FIG. 6 and FIG. 7, a manufacturing method of a light-emitting device can include following steps S21 to S27.

S21, a first electrode 10 is formed on a base substrate 1.

Illustratively, the light-emitting device has a bottom emission structure, and the first electrode 10 can be made of a transparent metal material, such as indium tin oxide (ITO). In this step S21, the first electrode 10 may be formed by a process such as evaporation or sputtering. S22, the base substrate 1 on which the first electrode 10 is formed is cleaned.

In this step, the base substrate 1 on which the first electrode 10 is formed can be cleaned with deionized water and isopropyl alcohol. For example, the base substrate 1 is cleaned with the deionized water and isopropyl alcohol respectively for 15 minutes, which is then blew dry with nitrogen, and baked and dried for 5 minutes at a baking temperature of, for example, 135° C. Further, the base substrate 1 on which the first electrode 10 is formed can be treated by ultraviolet ozone for 5 to 10 minutes, for example, 10 minutes, to clean organic pollutants on a surface of the first electrode 10 and passivate defects on the surface of the first electrode 10.

S23, an electron transport layer 20 is formed. Step S23 may specifically include steps S23a to S23c.

In step S23a, pre-sputtering is performed. Specifically, when an air pressure in a sputtering chamber reaches $5*10^{-4}$ Pa, an inert gas is introduced. The flow of the inert gas is between 30 sccm and 60 sccm (for example, between 40 sccm and 50 sccm), so that the air pressure in the sputtering chamber is kept between 0.4 Pa to 1 Pa, for example, between 0.5 Pa and 0.6 Pa. When the inert gas is introduced, the oxygen is also introduced, and the flow of the oxygen is 1% to 30% of the flow of the inert gas, optionally, the flow of the oxygen is 2% to 10% of the flow of the inert gas. Power of a radio frequency source in the sputtering chamber is set to be 20 W to 150 W, for example, 50 W to 100 W, to perform glow starting (i.e., pre-sputtering). During the glow starting, a baffle is disposed above the base substrate 1, so that after a target material is bombarded, and a film is formed on the baffle by sputtering. The glow starting functions in removing impurities on the target. Duration of step S23a may be between 3 and 10 minutes, for example, 5 minutes, to fully remove impurities on the target. After step S23a is completed, the baffle is opened, so that a film can be formed on the base substrate 1 by sputtering.

S23b, a second transport sub-layer 22 is formed at a side of the first electrode 10 away from the base substrate 1 by a sputtering process, and a material of the second transport sub-layer 22 includes ZnO.

Optionally, an air pressure in the sputtering chamber is between 0.4 Pa and 1 Pa, and the power of the radio frequency source in the sputtering chamber is between 20 W and 150 W. For example, the air pressure in the sputtering chamber is 0.4 Pa, or 0.6 Pa, or 0.8 Pa, or 1 Pa. For example, the power of the radio frequency source in the sputtering chamber is 20 W, 40 W, 60 W, 80 W, 100 W, 120 W, 140 W, or 150 W. The flow of the inert gas is between 30 sccm and 60 sccm, so that the second transport sub-layer 22 is formed on the first electrode 10 by sputtering.

Optionally, in step S23b, the flow of the inert gas can be kept the same as the flow of the inert gas in step S23a. Illustratively, the flow of the inert gas is between 40 sccm and 50 sccm, for example, the flow of the inert gas is 40 sccm, or 42 sccm, or 44 sccm, or 46 sccm, or 48 sccm, or 50 sccm. The flow of the oxygen can be kept the same as that in step S23a, and the flow of the oxygen can be 1% to 30% of the flow of the inert gas, preferably the flow of the oxygen is 2% to 10% of the flow of the inert gas, thus the oxygen vacancies in the second transport sub-layer 22 are appropriately reduced and the light emitting efficiency of the quantum dot light-emitting layer 30 is improved, while high electron transport capability of the second transport sub-layer 22 is guaranteed.

For example, in step S23b, the flow of the inert gas is between 30 sccm and 60 sccm, and the flow of the oxygen is between 0.3 sccm and 18 sccm. For example, the flow of the inert gas is 30 sccm and the flow of the oxygen is 0.3 sccm, or 1 sccm, or 3 sccm, or 5 sccm, or 7 sccm, or 9 sccm. As another example, the flow of the inert gas is 40 sccm, and the flow of the oxygen is 0.4 sccm, or 1 sccm, or 3 sccm, or 5 sccm, or 7 sccm, or 9 sccm, or 12 sccm. As another example, the flow of the inert gas is 50 sccm, and the flow of the oxygen is 0.5 sccm, or 1 sccm, or 3 sccm, or 5 sccm, or 7 sccm, or 9 sccm, or 12 sccm, or 15 sccm. As another example, the flow of the inert gas is 60 sccm, and the flow of the oxygen is 0.6 sccm, or 1 sccm, or 3 sccm, or 5 sccm, or 7 sccm, or 9 sccm, or 12 sccm, or 15 sccm, or 18 sccm.

S23c, a first transport sub-layer 21 is formed at a side of the second transport sub-layer 22 away from the base substrate 1 by a sputtering process, and a material of the first transport sub-layer 21 includes ZnO.

Optionally, in step S23c, the air pressure of the sputtering chamber and the power of the radio frequency source remain the same as those in step S23b. The sputtering gas introduced in step S23c includes the inert gas but does not include oxygen, and the flow of the inert gas can be kept the same as that in step S23b.

In the embodiment shown in FIG. 6, duration in which the inert gas is introduced in step S23c can be 2 to 4 times (for example, 3 times) duration in which the sputtering gas is introduced in step S23*b*, so that a thickness of the second transport sub-layer 22 is 2 to 4 times (for example, 3 times) a thickness of the first transport sub-layer 21. For example, the duration in which the sputtering gas is introduced in step S23*b* is 10 minutes, and the duration in which the inert gas is introduced in step S23*c* is 30 minutes.

In addition, a total thickness of the electron transport layer 20 can be made to be within a target range by controlling sputtering duration, the air pressure in the sputtering chamber and power of a sputtering source in steps S23*b* and S23*c*. In the embodiment shown in FIG. 6, the total thickness of the electron transport layer 20 may be between 5 nm and 150 nm. Preferably, the total thickness of the electron transport layer 20 is between 20 nm and 70 nm, so that the electron transport layer 20 exhibits a higher electron transport capacity. For example, the total thickness of the electron transport layer 20 is 20 nm, or 30 nm, or 40 nm, or 50 nm, or 60 nm, or 70 nm.

After step S23, steps S24 to S27 are performed.

S24, the quantum dot light-emitting layer 30 is formed. The quantum dot light-emitting layer 30 can be formed at a side of the electron transport layer 20 away from the base substrate 1 by a spin coating method, an inkjet printing or blade coating method.

A manufacturing method of the quantum dot light-emitting layer 30 can be referred to description in step S14 above, which will not be repeatedly described here.

S25, a hole transport layer 40 is formed at a side of the quantum dot light-emitting layer away from the base substrate 1.

S26, a hole injection layer 50 is formed at a side of the hole transport layer 40 away from the base substrate 1.

S27, a second electrode 60 is formed at a side of the hole injection layer 50 away from the base substrate 1.

A process of forming the hole transport layer 40 is referred to description in step S15 above, a step of forming the hole injection layer 50 is referred to description in step S16 above, and a step of forming the second electrode 60 is referred to description in step S17 above, which are not repeatedly described here.

Figure 8:
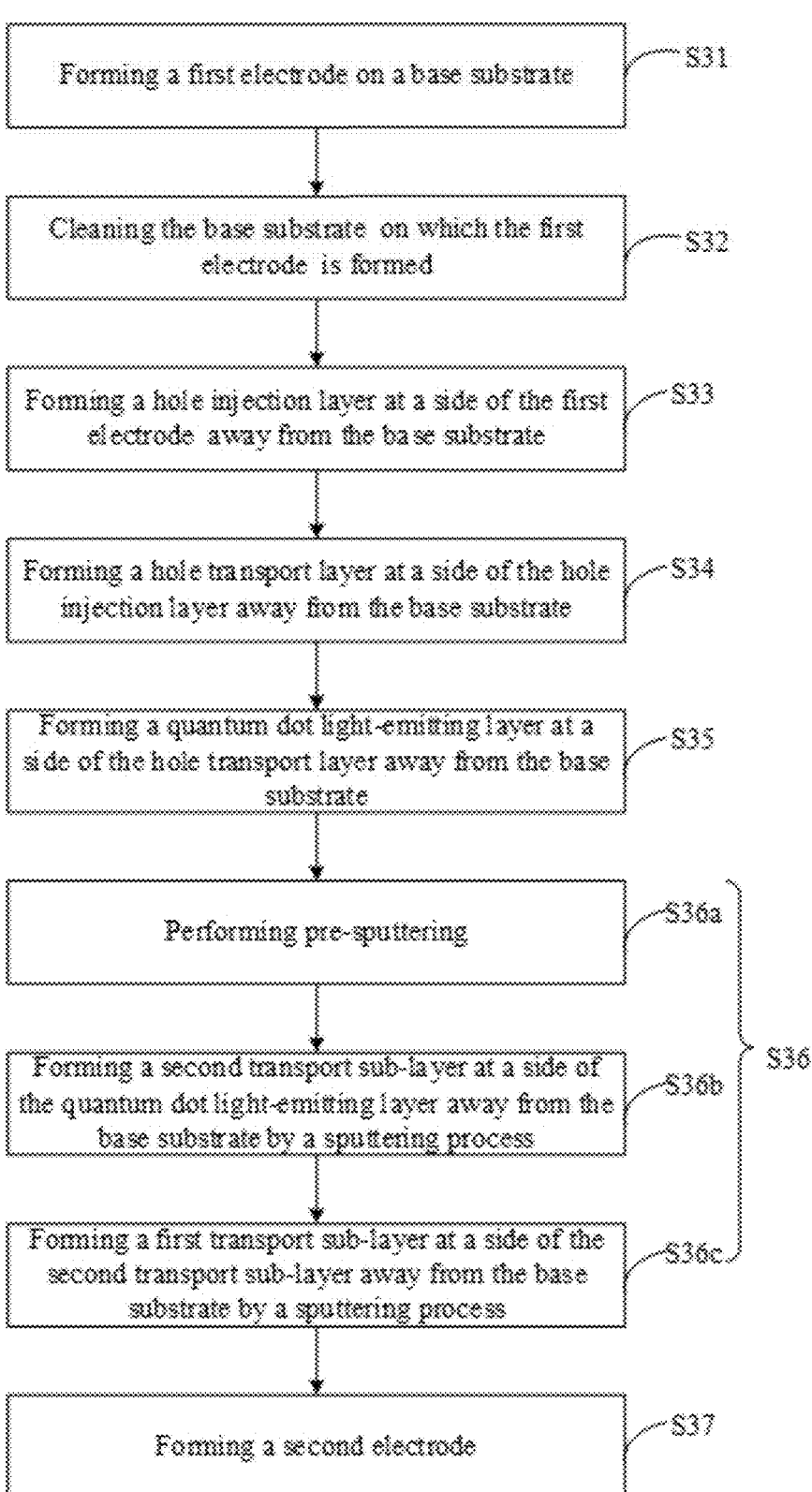
FIG. 8 is a flowchart of a manufacturing method of a light-emitting device according to still some embodiments of the present disclosure.
Figure 9:
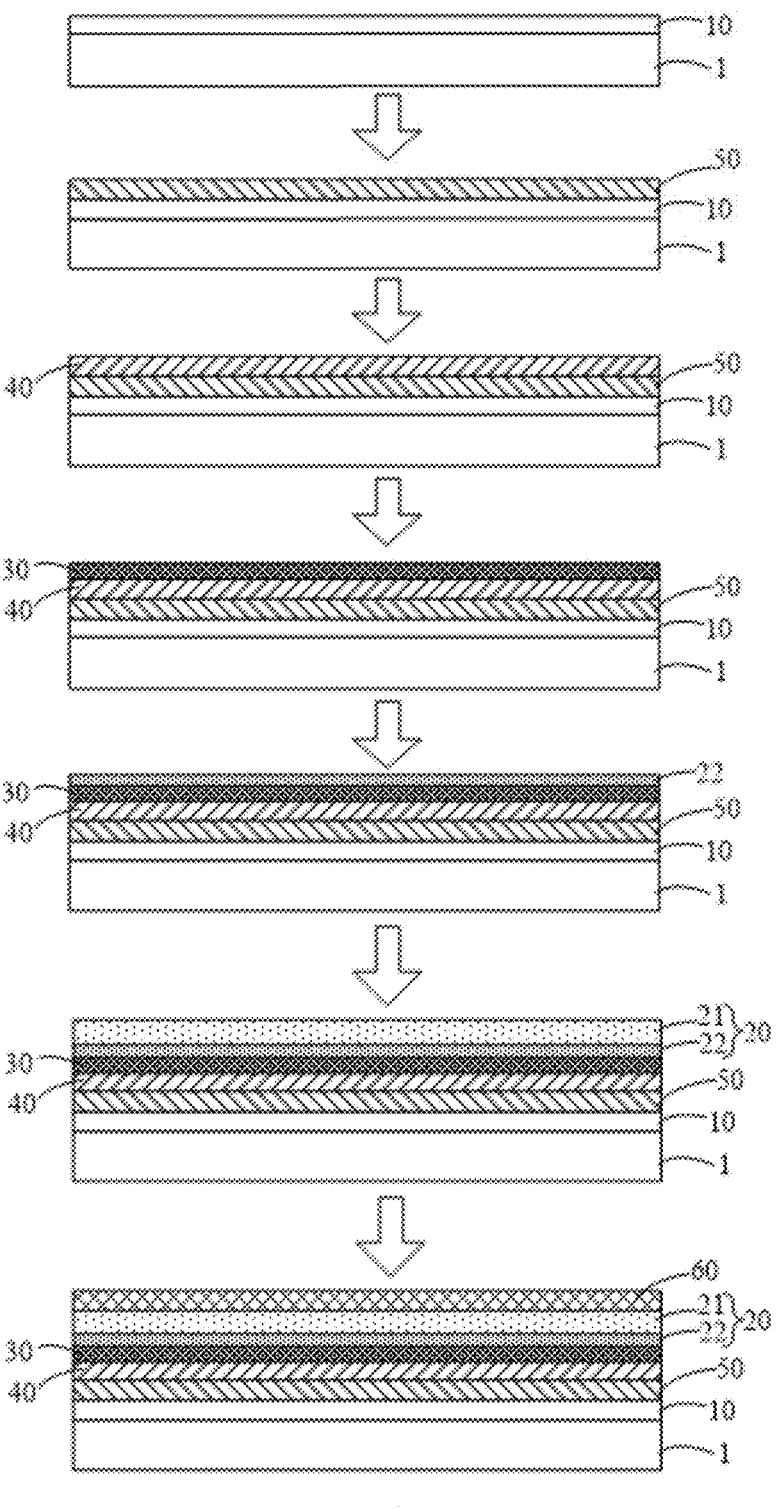
FIG. 9 is a schematic structural diagram corresponding to the manufacturing method in FIG. 8.

FIG. 8 is a flowchart of a manufacturing method of a light-emitting device provided in still some embodiments of the present disclosure, and FIG. 9 is a structural schematic diagram corresponding to the manufacturing method in FIG. 8, and the manufacturing method in FIG. 8 is used for manufacturing an upright light-emitting device. As shown in FIG. 8 and FIG. 9, the manufacturing method of the light-emitting device may include step S31 to S37.

S31, a first electrode 10 is formed on a base substrate 1.

Illustratively, the light-emitting device has a bottom emission structure, and the first electrode 10 can be made of a transparent metal material, such as indium tin oxide (ITO). In this step S21, the first electrode 10 may be formed by a process such as evaporation or sputtering.

S32, the base substrate 1 on which the first electrode 10 is formed is cleaned. Cleaning in this step S32 can be made in a same way as that in step S22, which is not repeatedly described here.

In step S33, a hole injection layer 50 is formed at a side of the first electrode 10 away from the base substrate 1.

In one embodiment, a PEDOT:PSS thin film can be prepared by a spin coating method with a rotating speed of 3000 rpm and a spin coating time of 40 seconds, which is then baked at a temperature of 150° C. for 10 minutes to form the hole injection layer 50.

Of course, the hole injection layer 50 also can be made of an inorganic material NiO.

In step S34, a hole transport layer 40 is formed at a side of the hole injection layer 50 away from the base substrate 1.

In one embodiment, step S34 may include: preparing a PVK layer by spin coating on the hole injection layer 50 with a rotating speed of 3000 rpm and a spin coating time of 40 seconds, which is then baked at 120° C. for 10 minutes, thereby obtaining the hole transport layer 40.

Of course, other organic or inorganic materials with high hole mobility such as TFB can also be used for the hole transport layer 40.

S35, a quantum dot light-emitting layer 30 is formed at a side of the hole transport layer away from the base substrate 1. A formation process of the quantum dot light-emitting layer can be referred to description in step S14, which is not repeatedly described here.

S36, an electron transport layer 20 is formed at a side of the quantum dot light-emitting layer 30 away from the base substrate 1. This step S36 may specifically include steps S36*a* to S36*c*.

S36*a*, pre-sputtering is performed. A process of the pre-sputtering can be referred to description in the above step S23*a*, which is not repeatedly described here.

S36*b*, a second transport sub-layer 22 is formed at a side of the quantum dot light-emitting layer 30 away from the base substrate 1 by a sputtering process, and a material of the second transport sub-layer 22 includes ZnO.

Optionally, an air pressure in the sputtering chamber is between 0.4 Pa and 1 Pa, and the power of the radio frequency source in the sputtering chamber is between 20 W and 150 W. For example, the air pressure in the sputtering chamber is 0.4 Pa, or 0.6 Pa, or 0.8 Pa, or 1 Pa. For example, the power of the radio frequency source in the sputtering chamber is 20 W, or 40 W, or 60 W, or 80 W, or 100 W, or 120 W, or 140 W, or 150 W. The flow of the inert gas is between 30 sccm and 60 sccm, so that the second transport sub-layer 22 is formed on the quantum dot light-emitting layer 30 by sputtering.

Optionally, in step S36*b*, the inert gas can be kept the same as that in step S36*a*. Illustratively, the flow of the inert gas is between 40 sccm and 50 sccm, for example, the flow of the inert gas is 40 sccm, or 42 sccm, or 44 sccm, or 46 sccm, or 48 sccm, or 50 sccm. The flow of the oxygen can be kept the same as that in step S36*a*, and the flow of the oxygen can be 1% to 30% of the flow of the inert gas, preferably the flow of the oxygen is 2% to 10% of the flow of the inert gas, thus the oxygen vacancies in the second transport sub-layer 22 is appropriately reduced and the light emitting efficiency of the quantum dot light-emitting layer 30 is improved, while a higher electron transport capability of the second transport sub-layer 22 is guaranteed.

For example, in step S36*b*, the flow of the inert gas is between 30 sccm and 60 sccm, and the flow of the oxygen is between 0.3 sccm and 18 sccm. For example, the flow of the inert gas is 30 sccm and the flow of the oxygen is 0.3 sccm, or 1 sccm, or 3 sccm, or 5 sccm, or 7 sccm, or 9 sccm. As another example, the flow of the inert gas is 40 sccm, and the flow of the oxygen is 0.4 sccm, or 1 sccm, or 3 sccm, or 5 sccm, or 7 sccm, or 9 sccm, or 12 sccm. As another example, the flow of the inert gas is 50 sccm, and the flow of the oxygen is 0.5 sccm, or 1 sccm, or 3 sccm, or 5 sccm, or 7 sccm, or 9 sccm, or 12 sccm, or 15 sccm. As another example, the flow of the inert gas is 60 sccm, and the flow of the oxygen is 0.6 sccm, or 1 sccm, or 3 sccm, or 5 sccm, or 7 sccm, or 9 sccm, or 12 sccm, or 15 sccm, or 18 sccm.

S36c, a first transport sub-layer 21 is formed at a side of the second transport sub-layer 22 away from the base substrate 1 by a sputtering process, and a material of the first transport sub-layer 21 includes ZnO.

Optionally, in step S36c, the air pressure of the sputtering chamber and the power of the radio frequency source remain the same as those in step S36b. The sputtering gas introduced in step S36c includes the inert gas but does not include oxygen, and the flow of the inert gas can be kept the same as that in step S36b.

In the embodiment shown in FIG. 8, duration in which the inert gas is introduced in step S36c can be 2 to 4 times (for example, 3 times) duration in which the sputtering gas is introduced in step S36b, so that a thickness of the second transport sub-layer 22 is 2 to 4 times (for example, 3 times) a thickness of the first transport sub-layer 21. For example, the duration in which the sputtering gas is introduced in step S36b is 10 minutes, and the duration in which the inert gas is introduced in step S36c is 30 minutes.

In addition, a total thickness of the electron transport layer 20 can be made to be within a target range by controlling sputtering duration, the air pressure in the sputtering chamber and power of a sputtering source in steps S36b and S36c. In the embodiment shown in FIG. 8 and FIG. 9, the total thickness of the electron transport layer 20 may be between 5 nm and 150 nm. Preferably, the total thickness of the electron transport layer 20 is between 20 nm and 70 nm, so that the electron transport layer 20 exhibits a higher electron transport capacity. For example, the total thickness of the electron transport layer 20 is 20 nm, or 30 nm, or 40 nm, or 50 nm, or 60 nm, or 70 nm.

After step S36, step S37 is performed to form a second electrode 60. A step of forming the second electrode 60 can be referred to description in step S17 above, which is not repeatedly described here.

In the embodiment shown in FIG. 8, the second transport sub-layer 22 being formed before the first transport sub-layer 21 is taken as an example for illustration. In other embodiments, the first transport sub-layer 21 may be formed before the second transport sub-layer 22, that is, orders of the above steps S36b and S36c may be interchanged.

It should be noted that various embodiments described above are all illustrated by taking the electron transport layer 20 including one first transport sub-layer 21 and one second transport sub-layer 22 as an example. Of course, there may be a plurality of first transport sub-layers 21 and there also may be a plurality of second transport sub-layers 22, materials of different layers may be same or different, which is not specifically limited here.

In the embodiment of the present disclosure, the electron transport layer 20 is formed by a sputtering process, thereby a large number of surface states are prevented from appearing in the electron transport layer 20 and further the light emitting efficiency of the light-emitting layer is improved. Furthermore, the oxygen is not introduced in forming the first transport sub-layer 21 of the electron transport layer 20; and the inert gas and oxygen are introduced in forming the second transport sub-layer 22 of the electron transport layer 20. In this way, the oxygen vacancies in the second transport sub-layer 22 can be reduced, while a large number of oxygen vacancies may exist in the first transport sub-layer 21, thus, for the whole electron transport layer 20, the light emitting efficiency of the light-emitting layer 30 is improved while the electron transport capability is guaranteed. In addition, in light-emitting devices, the hole transport layer 40 made of organic materials has a high hole mobility, and when there are too many oxygen vacancies in the electron transport layer 20, the electron transport layer 20 may achieve a high electron mobility, which results in imbalance of hole and electron transport in the light-emitting devices and causes Auger recombination. However, in the embodiment of the present disclosure, oxygen is introduced in fabricating the second transport sub-layer 22 of the electron transport layer 20, so that oxygen vacancies in the second transport sub-layer 22 can be reduced, and thus the electron mobility is reduced, which facilitates balance of hole and electron transport, and thus service life of the light-emitting device is prolonged. In addition, introduction of oxygen can reduce a conduction band minimum energy level of the second transport sub-layer 22, so that the conduction band minimum energy level of the second transport sub-layer 22 is closer to the LUMO energy level of the quantum dot light-emitting layer 30. Therefore, when the second transport sub-layer 22 is adjacent to the quantum dot light-emitting layer 30, it is more beneficial for electrons to be injected into the quantum dot light-emitting layer 30, and thus the light-emitting efficiency is improved.

Figure 10:
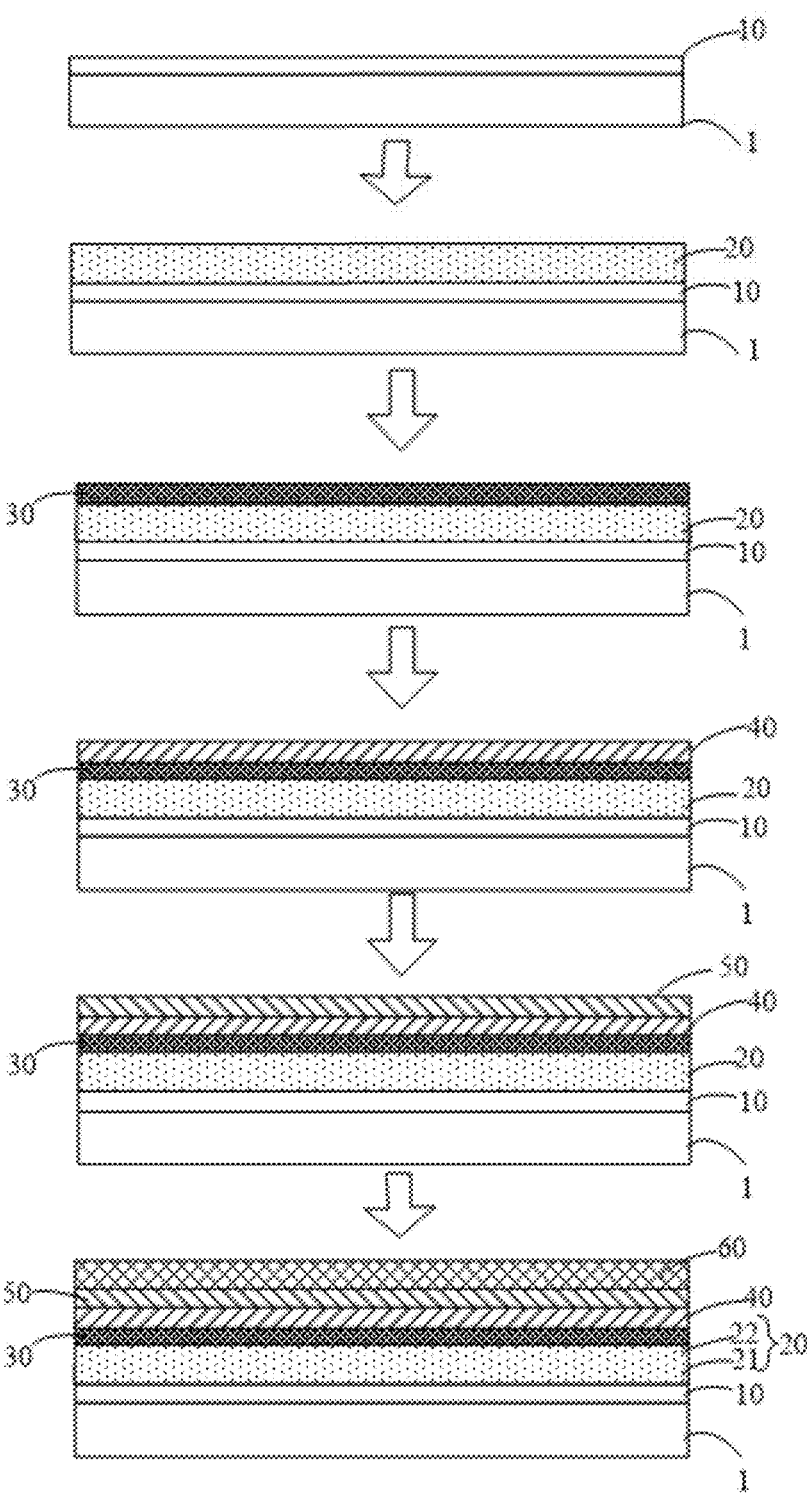
FIG. 10 is a schematic diagram of a manufacturing process of a light-emitting device according to a comparative embodiment.

FIG. 10 is a schematic diagram of a manufacturing process of a light-emitting device according to a comparative embodiment. As shown in FIG. 10, the light-emitting device in the comparative embodiment is manufactured by the following steps S41 to S47.

S41, a first electrode 10 is formed on a base substrate 1. A specific process of step S41 may be the same as that of step S11.

S42, the base substrate 1 on which the first electrode 10 is formed is cleaned. The specific process of step S42 may be the same as S12.

S43, an electron transport layer 20 is formed. Step S43 may specifically include steps S43a and S43b.

S43a, pre-sputtering is performed. The pre-sputtering step may be the same as the above step S13a.

S43b, the electron transport layer 20 is formed by a sputtering process. A process of step S43b is similar to the process of step S13b, only with difference that duration of step S43b is a sum of above steps S13b and S13c.

S44, the quantum dot light-emitting layer 30 is formed. A formation process of the quantum dot light-emitting layer 30 is the same as that in the above step S14.

S45, the hole transport layer 40 is formed. A formation process of the hole transport layer 40 is the same as that in the above step S15.

S46, the hole injection layer 50 is formed. A formation process of the hole injection layer 50 is the same as that in the above step S16.

S47, the second electrode 60 is formed. A process of step S47 is the same as that in above step S17.

That is to say, the light-emitting device formed in the comparative embodiment is similar to the light-emitting device in embodiment 1, only with difference that in the comparative embodiment, the electron transport layer 20 of the light-emitting device does not distinguish the first transport sub-layer 21 and the second transport sub-layer 22, and the sputtering gas is the inert gas in a whole process of forming the electron transport layer 20, excluding oxygen.

Figure 11:
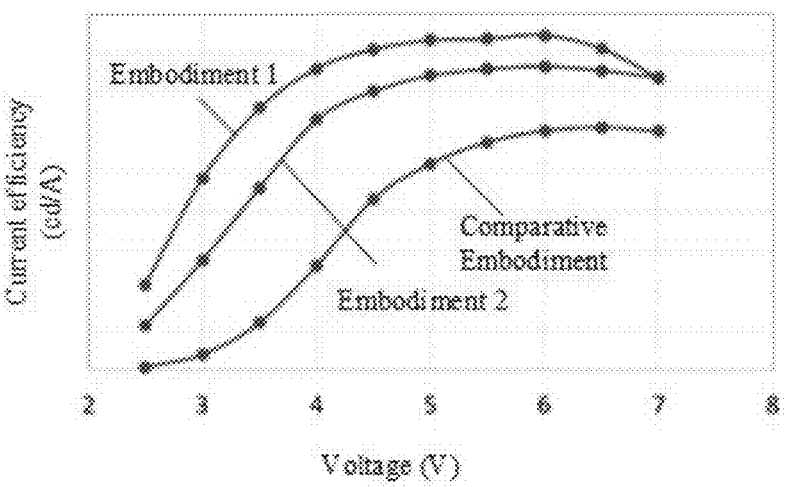
FIG. 11 is a curve graph of current efficiency and voltage characteristics of light-emitting devices according to different embodiments.
Figure 12:
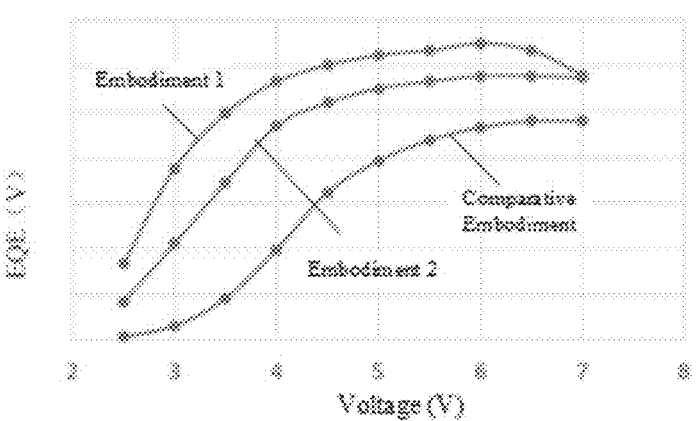
FIG. 12 is a curve graph of an external quantum efficiency (EOE)-voltage characteristic of light-emitting devices according to different embodiments.
Figure 13:
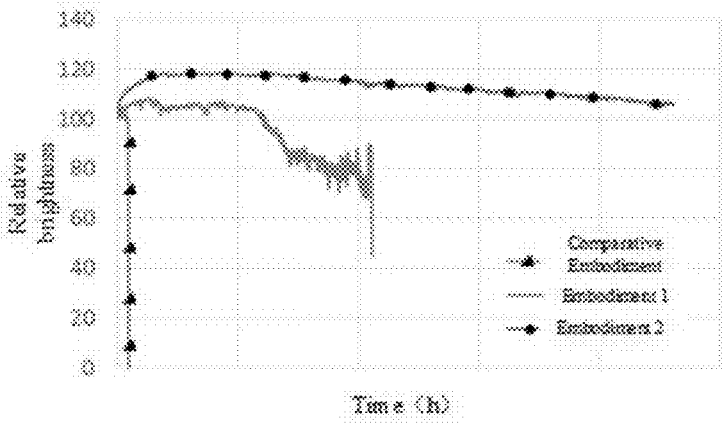
FIG. 13 is a graph showing a relationship between relative brightness and use time of light-emitting devices according to different embodiments.

FIG. 11 is a curve graph of current efficiency and voltage characteristics of the light-emitting devices according to different embodiments and FIG. 12 is a curve graph of an external quantum efficiency (EOE)-voltage characteristic of the light-emitting devices according to different embodiments, table 2 is a comparison table of performance of light-emitting devices according to different embodiments, and FIG. 13 is a graph showing a relationship between relative brightness and use time of light-emitting devices according to different embodiments. The light-emitting device in the embodiment 1 is a light-emitting device prepared by the above steps S11 to S17, and the light-emitting device in the embodiment 2 is a light-emitting device prepared by the above steps S21 to S17.

TABLE 2

|  | Maximum current efficiency (relative value) | Maximum external quantum efficiency (relative value) |
| --- | --- | --- |
| Comparative Embodiment | 1.00 | 1.00 |
| Embodiment 1 | 1.39 | 1.35 |
| Embodiment 2 | 1.31 | 1.21 |

As can be seen from FIG. 11, FIG. 12 and Table 2, compared with the comparative example, the current efficiency and external quantum efficiency of the light-emitting devices in the embodiment 1 and the embodiment 2 are higher. As can be seen from FIG. 13, compared with comparative embodiment, service life of the light-emitting devices in the embodiment 1 and the embodiment 2 is longer.

Figure 14:
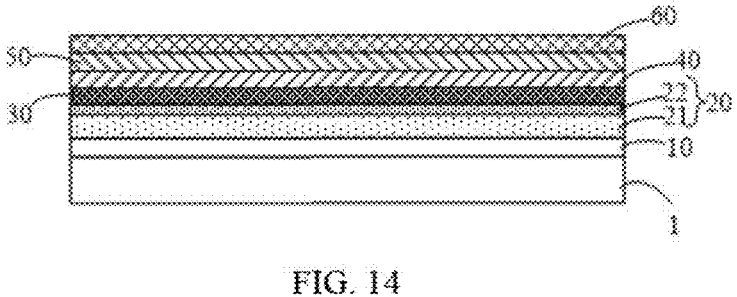
FIG. 14 is a schematic diagram of a light-emitting device according to some embodiments of the present disclosure.

FIG. 14 is a schematic diagram of a light-emitting device according to some embodiments of the present disclosure, and the light-emitting device is made by the manufacturing method according to the above embodiments of the present disclosure. As shown in FIG. 14, the light-emitting device includes the first electrode 10, the quantum dot light-emitting layer 30, and the electron transport layer 20. The first electrode 10 is arranged on the base substrate 1, and the quantum dot light-emitting layer 30 is arranged at the side of the first electrode 10 away from the base substrate 1. The electron transport layer 20 is arranged at a side of the quantum dot light-emitting layer 30 close to or away from the first electrode 10. The electron transport layer 20 includes a first transport sub-layer 21 and a second transport sub-layer 22 which are arranged in layer configuration. A material of the first transport sub-layer 21 and a material of the second transport sub-layer 22 both include n-type metal oxides, and an oxygen content of the first transport sub-layer 21 is less than an oxygen content of the second transport sub-layer 22.

In the light-emitting device according to the embodiment of the present disclosure, the electron transport layer 20 can be prepared by the sputtering process, thereby the surface states are prevented from occurring on the electron transport layer 20, and thus the light emitting efficiency of the quantum dot light-emitting layer 30 is improved. In addition, the oxygen content of the first transport sub-layer 21 is smaller than the oxygen content of the second transport sub-layer 22, therefore, no oxygen can be introduced in sputtering the first transport sub-layer 21 and oxygen can be introduced in sputtering the second transport sub-layer 22, thus, for the whole electron transport layer 20, the light emitting efficiency of the light-emitting layer 30 is improved while the electron transport capability may be guaranteed.

Optionally, the electron transport layer 20 can be made of at least one of: zinc oxide, zinc magnesium oxide, gallium doped zinc oxide or aluminum doped zinc oxide. For example, the material of the first transport sub-layer 21 and the material of the second transport sub-layer 22 both include ZnO. As another example, the material of the first transport sub-layer 21 and the material of the second transport sub-layer 22 both include ZnMgO. As another example, the material of one of the first transport sub-layer 21 and the second transport sub-layer 22 includes ZnO, and the other includes ZnMgO.

In some embodiments, the thickness of the first transport sub-layer 21 is 2 to 4 times the thickness of the second transport sub-layer 22, so that an oxygen vacancy content in the whole electron transport layer 20 is within a reasonable range, thereby the light emitting efficiency of the quantum dot light-emitting layer 30 is improved while guaranteeing the electron transport capability. For example, the thickness of the first transport sub-layer 21 is three times the thickness of the second transport sub-layer 22.

In some embodiments, the total thickness of the electron transport layer 20 is between 5 nm and 150 nm, so that the electron transport layer 20 has a higher electron transport capability.

The light-emitting device shown in FIG. 14 can be an inverted light-emitting device prepared by the manufacturing method shown in FIG. 4. As shown in FIG. 14, the light-emitting device further includes a hole injection layer 50, a hole transport layer 40 and a second electrode 60. The first electrode 10 is arranged opposite to the second electrode 60, and the hole injection layer 50, the hole transport layer 40, the electron transport layer 20 and the quantum dot light-emitting layer 30 are all arranged between the first electrode 10 and the second electrode 60. The hole transport layer 40 is arranged at the side of the quantum dot light-emitting layer 30 away from the electron transport layer 20, and the hole injection layer 50 is arranged at the side of the hole transport layer 40 away from the quantum dot light-emitting layer 30. In some embodiments, as shown in FIG. 14, the light-emitting device is the inverted light-emitting device, the quantum dot light-emitting layer 30 is located at the side of the electron transport layer 20 away from the first electrode 10, the hole transport layer 40 is located at the side of the quantum dot light-emitting layer 30 away from the first electrode 10, the hole injection layer 50 is located at the side of the hole transport layer 40 away from the first electrode 10, and the second electrode 60 is located at the side of the hole injection layer 50 away from the first electrode 10.

In FIG. 14, the second transport sub-layer 22 may be located at the side of the first transport sub-layer 21 away from the first electrode 10, that is, the second transport sub-layer 22 is adjacent to the quantum dot light-emitting layer 30. Compared with the first transport sub-layer 21, the oxygen vacancies in the second transport sub-layer 22 are reduced, so that the conduction band minimum energy level of the second transport sub-layer 22 is closer to the LUMO energy level of the quantum dot light-emitting layer 30, which is more beneficial for electrons to be injected into the quantum dot light-emitting layer 30, and thus the light-emitting efficiency is improved.

The first electrode 10 can be made of light-transmitting materials such as indium tin oxide (ITO), and the second electrode 60 can be made of metal, such as silver. Materials and thicknesses of the quantum dot light-emitting layer 30, the hole injection layer 50 and the hole transport layer 40 can be specifically referred to description in the manufacturing method described above, which are not repeatedly described here.

Figure 15:
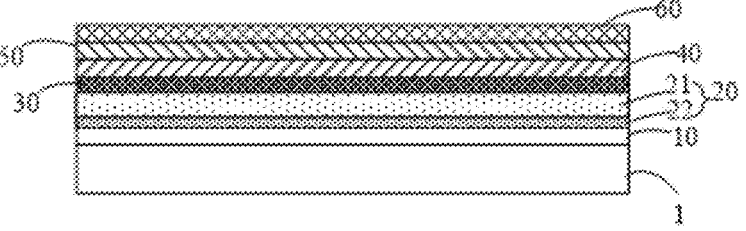
FIG. 15 is a schematic diagram of a light-emitting device according to some other embodiments of the present disclosure.

FIG. 15 is a schematic diagram of a light-emitting device according to some other embodiments of the present disclosure. The light-emitting device shown in FIG. 15 is an inverted light-emitting device prepared by the manufacturing method shown in FIG. 6. The light-emitting device shown in FIG. 15 is similar to the light-emitting device shown in FIG. 14, only with difference that in FIG. 15, the first transport sub-layer 21 of the electron transport layer 20 is located at the side of the second transport sub-layer 22 away from the first electrode 10.

In FIG. 15, materials and thicknesses of respective film layers can be referred to description in the above manufacturing method, which are not repeatedly described here.

Figure 16:
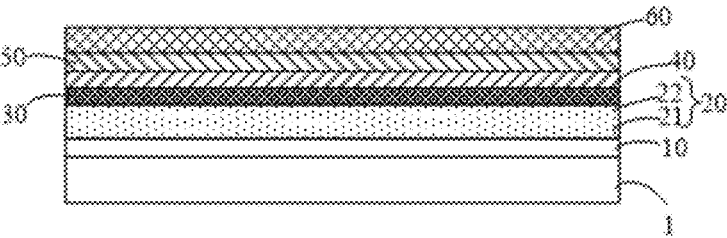
FIG. 16 is a schematic diagram of a light-emitting device according to further some embodiments of the present disclosure.

FIG. 16 is a schematic diagram of a light-emitting device according to further some embodiments of the present disclosure. The light-emitting device shown in FIG. 16 is an inverted light-emitting device prepared by the manufacturing method shown in FIG. 8, and the light-emitting device can be an upright light-emitting device. Difference between the light-emitting device in FIG. 16 and the light-emitting device in FIG. 14 is that stacking orders of film layers are different. In FIG. 16, the light-emitting device includes the first electrode 10, the hole injection layer 50, the hole transport layer 40, the quantum dot light-emitting layer 30, the electron transport layer 20, and the second electrode 60, which are sequentially arranged in a direction away from the base substrate 1. The electron transport layer 20 includes the first transport sub-layer 21 and the second transport sub-layer 22, and the first transport sub-layer 21 is located at the side of the second transport sub-layer 22 away from the base substrate 1. In FIG. 16, materials of the first transport sub-layer 21 and the second transport sub-layer 22 can be the same as those in FIG. 14, and both are made of n-type metal oxides. For example, both the first transport sub-layer 21 and the second transport sub-layer 22 are made of ZnO, but of course, can be made of ZnMgO, ZnGaO, ZnAlO, etc. The thickness of the first transport sub-layer 21 is 2 to 4 times the thickness of the second transport sub-layer 22, so that the oxygen vacancy content in the whole electron transport layer 20 is within a reasonable range, thereby the light emitting efficiency of the quantum dot light-emitting layer 30 is improved while guaranteeing the electron transport capability. For example, the thickness of the first transport sub-layer 21 is three times the thickness of the second transport sub-layer 22.

In FIG. 16, the total thickness of the electron transport layer 20 is between 5 nm and 150 nm, so that the electron transport layer 20 has a higher electron transport capability.

In FIG. 16, the first electrode 10 can be made of light-transmitting materials such as indium tin oxide (ITO), and the second electrode 60 can be made of metal, such as silver. Materials and thicknesses of the quantum dot light-emitting layer 30, the hole injection layer 50 and the hole transport layer 40 can be specifically referred to description in the manufacturing method shown in FIG. 8, which are not repeatedly described here.

It should be noted that, for the light-emitting device shown in FIG. 16, positions of the first transport sub-layer 21 and the second transport sub-layer 22 may be interchanged.

A display substrate is further provided in an embodiment of the present disclosure, which includes the light-emitting device according to the above embodiments.

A display apparatus is further provided in an embodiment of the present disclosure, which includes the display substrate described above, wherein the display apparatus can be any product or component with a display function such as an electronic paper, a mobile phone, a tablet computer, a television, a display, a notebook computer, a digital photo frame, a navigator or the like.

Since for the light-emitting device according to the embodiment of the present disclosure, the light emitting efficiency of the quantum dot light-emitting layer 30 can be improved and the service life of the light-emitting device can be prolonged while guaranteeing the electron transport capability, the display substrate and the display apparatus using the light-emitting device have better display effect and longer service life.

It can be understood that the above embodiments are only exemplary embodiments adopted for explaining the principles of the present disclosure, but the present disclosure is not limited thereto. It is obvious to those skilled in the art that various variations and improvements can be made without departing from the spirit and essence of the present disclosure, which are also regarded as within the protection scope of the present disclosure.

The invention claimed is:

1. A light-emitting device, comprising:
a first electrode disposed on a base substrate;
a quantum dot light-emitting layer disposed at a side of the first electrode away from the base substrate; and
an electron transport layer disposed at a side of the quantum dot light-emitting layer close to or away from the first electrode, the electron transport layer comprising a first transport sub-layer and a second transport sub-layer which are arranged in layer configuration, a material of the first transport sub-layer and a material of the second transport sub-layer both comprising n-type metal oxides, and an oxygen content of the first transport sub-layer being less than an oxygen content of the second transport sub-layer.

2. The light-emitting device according to claim 1, wherein a thickness of the first transport sub-layer is 2 to 4 times a thickness of the second transport sub-layer.

3. The light-emitting device according to claim 1, wherein a total thickness of the electron transport layer is between 5 nm and 150 nm.

4. The light-emitting device according to claim 1, wherein the first transport sub-layer is arranged at a side of the quantum dot light-emitting layer away from the base substrate, and the second transport sub-layer is arranged at a side of the first transport sub-layer away from the base substrate.

5. The light-emitting device according to claim 1, wherein the first transport sub-layer is arranged between the quantum dot light-emitting layer and the first electrode, and the second transport sub-layer is arranged between the first transport sub-layer and the first electrode.

6. The light-emitting device according to claim 1, wherein the light-emitting device further comprises a hole injection layer, a hole transport layer and a second electrode, wherein the first electrode is arranged opposite to the second electrode, the hole injection layer, the hole transport layer, the electron transport layer and the quantum dot light-emitting layer are all arranged between the first electrode and the second electrode, the hole transport layer is arranged at a side of the quantum dot light-emitting layer away from the electron transport layer and the hole injection layer is arranged at a side of the hole transport layer away from the quantum dot light-emitting layer.

7. The light-emitting device according to claim 1, wherein the electron transport layer is made of at least one of: zinc oxide, zinc magnesium oxide, gallium doped zinc oxide or aluminum doped zinc oxide.

8. A display substrate, comprising the light-emitting device according to claim 1.

9. A display apparatus, comprising the display substrate according to claim 8.

10. The display substrate according to claim 8, wherein a thickness of the first transport sub-layer is 2 to 4 times a thickness of the second transport sub-layer.

11. The display substrate according to claim 8, wherein a total thickness of the electron transport layer is between 5 nm and 150 nm.

12. The display substrate according to claim 8, wherein the first transport sub-layer is arranged at a side of the quantum dot light-emitting layer away from the base substrate, and the second transport sub-layer is arranged at a side of the first transport sub-layer away from the base substrate.

13. A manufacturing method of a light-emitting device, comprising:

forming a first electrode on a base substrate; and forming an electron transport layer and a quantum dot light-emitting layer respectively, wherein the quantum dot light-emitting layer is arranged at a side of the first electrode away from the base substrate; and the electron transport layer is arranged at a side of the quantum dot light-emitting layer close to or away from the first electrode;

wherein forming the electron transport layer comprises:

forming a first transport sub-layer and a second transport sub-layer respectively through a sputtering process, wherein a material of the first transport sub-layer and a material of the second transport sub-layer both comprises n-type metal oxides; and a sputtering gas in forming the first transport sub-layer comprises an inert gas, and a sputtering gas in forming the second transport sub-layer comprises an inert gas and oxygen.

14. The manufacturing method according to claim 13, wherein in forming the second transport sub-layer, a flow of the oxygen is 1% to 30% of a flow of the inert gas.

15. The manufacturing method according to claim 14, wherein the flow of the inert gas is between 30 sccm to 60 sccm in forming the second transport sub-layer.

16. The manufacturing method according to claim 13, wherein a thickness of the first transport sub-layer is 2 to 4 times a thickness of the second transport sub-layer.

17. The manufacturing method according to claim 13, wherein a total thickness of the electron transport layer is between 5 nm and 150 nm.

18. The manufacturing method according to claim 13, wherein in forming the first transport sub-layer and the second transport sub-layer, an air pressure in a sputtering chamber is between 0.4 Pa and 1 Pa, and power of a radio frequency source in the sputtering chamber is between 20 W and 150 W.

19. The manufacturing method according to claim 13, wherein the step of forming the first transport sub-layer is performed before or after the step of forming the quantum dot light-emitting layer; and the step of forming the second transport sub-layer is performed after or before the step of forming the first transport sub-layer.

20. The manufacturing method according to claim 13, wherein the step of forming the electron transport layer is performed before the step of forming the quantum dot light-emitting layer, and the manufacturing method further comprises:

forming the hole transport layer at a side of the quantum dot light-emitting away from the base substrate;

forming the hole injection layer at a side of the hole transport layer away from the base substrate; and forming the second electrode at a side of the hole injection layer away from the base substrate; or, the step of forming the electron transport layer is performed after the step of forming the quantum dot light-emitting layer, and the manufacturing method further comprises:

forming the hole injection layer at the side of the first electrode away from the base substrate;

forming the hole transport layer at the side of the hole injection layer away from the base substrate; and forming the second electrode at the side of the electron transport layer away from the base substrate.

\* \* \* \* \*